(12) United States Patent
Edwards et al.

(10) Patent No.: US 6,415,002 B1
(45) Date of Patent: Jul. 2, 2002

(54) PHASE AND AMPLITUDE MODULATION OF BASEBAND SIGNALS

(75) Inventors: Fraser Murray Edwards; David Alan Brown, both of Bishop's Stortford (GB)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/056,841

(22) Filed: Apr. 7, 1998

(51) Int. Cl.[7] .................. H04L 27/20; H04L 5/12; H03C 3/00; H03D 3/24
(52) U.S. Cl. .............. 375/261; 375/302; 375/376; 332/103
(58) Field of Search ............... 375/261, 298, 375/269, 279, 280, 281, 308, 302, 376, 327; 332/103, 144, 145; 455/42, 260; 370/215; 327/156; 331/18, 25, 1 R, 1 A

(56) References Cited

U.S. PATENT DOCUMENTS 5,319,675 A * 6/1994 Osaka ........................ 375/295
5,434,887 A * 7/1995 Osaka ........................ 375/295
5,495,500 A * 2/1996 Jovanovich ................. 375/206
5,784,412 A * 7/1998 Ichihara ..................... 375/302
6,038,428 A * 3/2000 Mizusawa et al. ............ 455/69

* cited by examiner

*Primary Examiner*—Betsy L. Deppe
(74) *Attorney, Agent, or Firm*—Lee, Mann, Smith, McWilliams, Sweeney and Ohlson

(57) ABSTRACT

A baseband signal modulator provides a phase and amplitude modulated carrier signal. First and second phase modulators each receive a common reference signal and derive therefrom a carrier signal frequency. The phase modulators each receive a respective pair of phase-encoded data signals so as to provide respective first and second phase-encoded carrier. The modulator outputs are summed to provide the phase and amplitude modulated carrier signal. Each phase modulator includes a respective phase locked loop incorporating an oscillator locked via the common reference signal to the carrier signal frequency, and a phase adder having a first input for receiving the carrier frequency signal and having second and third inputs for receiving the respective pair of data encoded signals.

14 Claims, 3 Drawing Sheets

PHASE AND AMPLITUDE MODULATION OF BASEBAND SIGNALS

FIELD OF THE INVENTION

The present invention relates to a method and apparatus for phase and amplitude modulation of a baseband signal and a system incorporating the same.

In particular, the present invention relates to a method and apparatus for phase and amplitude modulation of a digital signal and a system incorporating the same.

BACKGROUND TO THE INVENTION

Digital communication equipment is used in a wide variety of devices for the transmission of digital information. Such information includes numerical data in computers and digital encodings of voice in telecommunications systems.

The majority of modulation formats involve impressing a time varying amplitude and phase characteristic onto a carrier wave in a predetermined manner whereby there is a fixed relationship between the information that the signal is to carry and the instantaneous values of the phase and amplitude. For a carrier as defined in equation (1):

$$\text{Carrier} = \text{Re}[e^{j\omega t}] \quad (1)$$

and the modulation defined by equation (2):

$$\text{Modulation} = \text{Re}[r(t) e^{j\phi(t)}] \quad (2)$$

then the modulated signal is defined equally by equations (3) and (4):

$$\text{Modulated Signal} = \text{Re}[r(t) e^{j(\omega t + \phi(t))}] \quad (3)$$

$$\text{Modulated Signal} = r(t) \cos(\omega t + \phi(t)) \quad (4)$$

Many of the commonly used modulation formats involve moderate or large amounts of amplitude variation in the signal envelope and require highly linear power amplifiers to maintain signal distortion and spectral regrowth at acceptably low levels. As a consequence, power amplifiers, for example in wireless telephone handsets, tend to exhibit poor power-added efficiency with a resultant high DC power consumption and short battery life for the handsets.

Known partial solutions for alleviating these problems use either amplifier linearization techniques or constant envelope modulation formats. Such amplifier linearization techniques are highly complex and thus suitable for use only in base stations. They are generally too complex and expensive for use in handsets. Additionally, constant envelope modulation formats, such as that employed in GSM systems, permit encoding of only 1 bit per symbol rather than the 2 bits per symbol of, for example, π/4 DQPSK.

OBJECT TO THE INVENTION

The present invention seeks to provide an improved method and apparatus for simultaneously phase- and amplitude-modulating a radio frequency (RF) or microwave carrier.

SUMMARY OF THE INVENTION

According to a first aspect of the present invention there is provided a baseband signal modulator comprising first and second phase modulators arranged to receive a common reference signal and each arranged to receive a phase-encoded data signal and to provide a phase-encoded carrier signal derived from said data signal and said common reference signal, circuit means arranged to sum said phase-encoded carrier signals, whereby to provide a phase and amplitude modulated carrier signal.

Preferably, each said phase-encoded carrier signal is constant-envelope.

Preferably, both phase and amplitude of said phase and amplitude modulated carrier signal may be varied dependent upon the phase of each said input data signal.

Preferably, a phase modulator comprises a phase-locked loop and an amplitude-adjustment circuit.

The phase-locked loop may be an offset phase-locked loop.

The amplitude-adjustment circuit may comprise a coarse attenuator and a power amplifier.

Advantageously, the power amplifiers can be run much closer to their compression point than is the case in known modulators, and the power amplifiers can be of a less linear and more power-efficient design.

Advantageously, the more power-efficient design leads to longer battery life where the present invention is employed in mobile handsets.

Advantageously, spectral re-growth and consequential interference into the adjacent channels is much reduced because the amplifiers run with a constant power envelope.

Advantageously, since two amplifiers are used, each one only carries half the required power thereby reducing the cost of the output devices. Although two amplifiers are required this may still represent a significant cost reduction for a base station.

Advantageously, all the advantages of loop filtering by the method of phase modulation in the loop, as currently exploited in GSM systems, can be gained for non-constant envelope modulation formats.

Advantageously, the present invention may use components already developed and available for existing GSM systems, thereby both minimizing chip re-design costs and keeping manufacture costs low.

Advantageously, since amplitude control is inherent in the technique, the control of final power output level can be incorporated into the phase modulation of the two signal arms.

Preferably, input data signals are phase-encoded using distinct phases.

The signal modulator may additionally comprise a signal source providing said reference signal.

Each modulator may be arranged to receive a phase-encoded digital data signal.

Preferably, the signal modulator additionally comprises digital signal processing means whereby to provide said phase-encoded data signals.

According to a further aspect of the present invention there is provided a telecommunications system comprising one or more signal modulators according to claim 1.

In a preferred embodiment, said phase and amplitude modulated carrier signal is a radio frequency signal.

According to a further aspect of the present invention there is provided a wireless transmission system comprising a signal modulator according to the present invention and an antenna and a low-pass filter arranged to receive said phase and amplitude modulated carrier signal and to provide it to said antenna.

Use of GSM components also enables use of simple, low-cost output filters.

According to a further aspect of the present invention there is provided a wireless telecommunications system comprising one or more signal modulators according to claim 1.

According to a further aspect of the present invention there is provided a method of generating a phase and amplitude modulated signal comprising the steps of: providing a reference input signal; providing first and second data input signals; generating a phase-modulated carrier signal from each said data signal and the said reference signal; combining said phase-modulated carrier signals to provide a phase and amplitude modulated carrier signal.

According to a further aspect of the present invention there is provided a method of generating a phase and amplitude modulated signal comprising the steps of: providing target signal amplitude and phase values; providing a reference input signal; providing first and second data input signals characterised by said target signal amplitude and phase values; phase-modulating each said data signal separately onto said reference signal; combining said phase-modulated signals to form a phase and amplitude modulated signal characterised by said target signal amplitude and phase values.

Advantageously, the modulation format may be wholly controlled by the baseband DSP sections of the radio and, where the PLL's can be tuned to the carrier frequencies, the present invention lends itself to use in multimode type radios.

Advantageously, more information can be sent through a given channel if both phase and amplitude modulation are employed.

Advantageously, it is easy to change output modulation schemes by changing the phase values of each DSP output signal.

Advantageously, the present invention does not require highly-linear power amplifier circuits, thereby reducing manufacturing costs.

The invention is also directed to a method by which the described apparatus operates and includes method steps for carrying out every function of the apparatus.

The invention also provides for a system for the purposes of digital signal processing which comprises one or more instances of apparatus embodying the present invention, together with other additional apparatus.

The preferred features may be combined as appropriate, as would be apparent to a skilled person, and may be combined with any of the aspects of the invention.

BRIEF DESCRIPTION OF THE DRAWINGS

In order to show how the invention may be carried into effect, embodiments of the invention are now described below by way of example only and with reference to the accompanying figures in which.

DETAILED DESCRIPTION OF INVENTION

Figure 1:
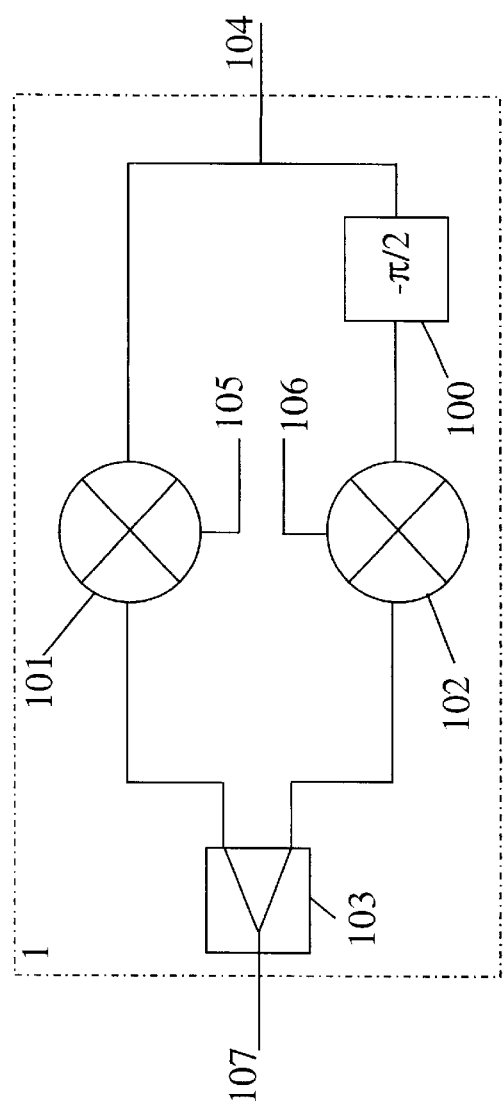
FIG. 1 shows a block diagram of a phase adder in accordance with the present invention.

A general representation of a phase and amplitude modulated signal, S1, is given by equation (5):

$$S1 = r\cos(\omega t + \phi) \quad (5)$$

where r is the instantaneous amplitude, $\phi$ is the required phase, and $\omega$ is the angular frequency. Such a signal can also be represented by the geometric sum of two phase modulated signals, S2 and S3, defined in equations (6) and (7) respectively:

$$S2 = \cos(\omega t + \psi) \quad (6)$$

$$S3 = \cos(\omega t + \xi) \quad (7)$$

for appropriate values of $\psi$ and $\xi$.

The sum, S4, of signals S2 and S3, is defined by equation (8):

$$S4 = 2\cos\left(\frac{\psi - \xi}{2}\right)\cos\left(\omega t + \frac{\psi + \xi}{2}\right) \quad (8)$$

Comparing equations (5) and (8) and equating the amplitude, r, and phase, $\phi$, components of signals S1 and S4 requires that equations (9) and (10) hold:

$$r = 2\cos\left(\frac{\psi - \xi}{2}\right) \quad (9)$$

$$\phi = \frac{\psi + \xi}{2} \quad (10)$$

In general the baseband data signal can be represented as inphase, i, and quadrature, q, information as for a conventional Cartesian modulator. Such a signal is usually pulse shaped prior to directly modulating a single carrier, whereby to create a signal of the form given in equation (5). The relationships between i, q, r, and $\phi$ for a Cartesian modulator are given by the known pair of equations (11) and (12):

$$r = \sqrt{i^2 + q^2} \quad (11)$$

$$\phi = \arctan(q/i) \quad (12)$$

Equating the right-hand sides of equations (11) and (12), defining r and $\phi$, to those of equations (9) and (10) respectively requires equations (13) and (14) to hold:

$$\psi + \xi = 2\arctan(q/i) \quad (13)$$

$$\psi + \xi = 2\arctan\left(\frac{q}{i}\right) \quad (13)$$

$$\psi - \xi = 2\arccos\left(\frac{\sqrt{i^2 + q^2}}{2}\right) \quad (14)$$

Solving for $\psi$ and $\xi$ gives the constraints on $\psi$ and $\xi$ shown in equations (15) and (16) respectively:

$$\psi = \arctan\left(\frac{q}{i}\right) + \arccos\left(\frac{\sqrt{i^2 + q^2}}{2}\right) \quad (15)$$

$$\xi = \arctan\left(\frac{q}{i}\right) - \arccos\left(\frac{\sqrt{i^2 + q^2}}{2}\right) \quad (16)$$

Consequently, both $\psi$ and $\xi$ can be derived from the original inphase, i, and quadrature, q, data generated by the pulse shaping filters.

By phase-modulating two separate oscillators and summing the respective output signals, signal S4, of equation (9), can be produced. Signal S4 has both phase and amplitude modulation and is identical to the signal, S1, defined by equation (5).

Not only, therefore, can an amplitude- and phase-modulated signal be generated through selection of appropriate ψ and ξ, but the amplitude of the resultant signal can also be adjusted by scaling the values of −ψ and ξ.

The method of operation of the present invention is based upon selection of appropriate phase values, ψ and ξ, for input data signals, so as to generate a phase and amplitude modulated signal as described above.

The phase adder (1) shown in FIG. 1 comprises a π/2 phase shifter (100), two signal mixers (101, 102) and a signal combiner (103).

The circuit is arranged to receive an unmodulated input signal (104) which is fed directly to the first mixer (101) and indirectly, via the π/2 phase shifter (100), to the second mixer (102).

A data input signal feed (105, 106) is also provided to each mixer, and the mixer outputs are fed to the signal combiner (103) which provides as an output a signal (107) which is the sum of the two input signals.

Where the unmodulated input signal is of the form $\cos(\omega t)$ and the inputs (105, 106) to the mixers (101, 102) are of the form $\cos(\psi)$ and $\sin(\psi)$ respectively (the order being necessary to obtain the correct phase), the resulting output signal from the combiner (103) is of the form $\cos(\omega t+\psi)$.

Figure 2:
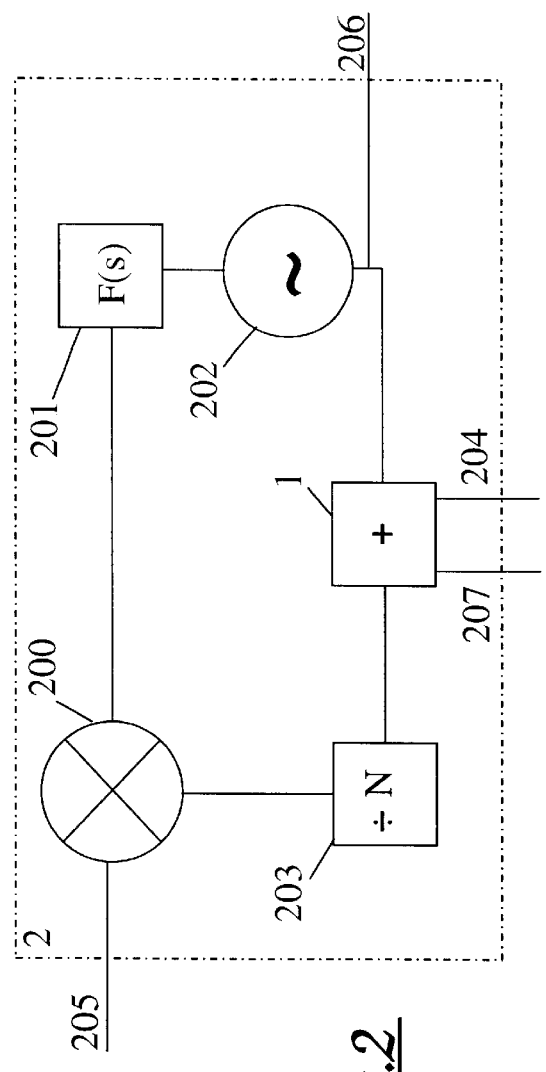
FIG. 2 shows a block diagram of a phase locked loop in accordance with the present invention.

Referring to FIG. 2, a phase-locked loop (PLL) circuit (2) is shown comprising a phase detector (200), a loop filter (201), a voltage-controlled oscillator (VCO) (202), a phase adder (1) (for example that of FIG. 1) and a divider (203). The PLL takes as inputs a data signals (204, 207) and a reference signal (205), and provides an output signal (206) consisting of the data signal phase-modulated onto a carrier signal, being a signal having N times the frequency of the reference signal, where N is the phase division ratio as employed in the phase divider (203). The output signal of the PLL is that output from the VCO (202), which is also provided, along with the input data signal, as inputs to the phase adder (1). The data signals (204, 207) are fed to the data feeds (105, 106) of the example phase adder (1) described above. Phase adder output is fed to the phase divider (203), the frequency of whose output signal is an N-th of the input frequency, and whose output signal is in turn fed, along with the PLL's reference signal input (205), to the phase detector (200). Output from the phase detector (200) is fed to the loop filter (201) whose output is fed back as input to the VCO (202) to complete the PLL circuit.

Where for example N is large, an offset PLL may be used. This may be achieved by introducing an additional frequency translation stage between the existing VCO (202) and the output feed (206).

Figure 3:
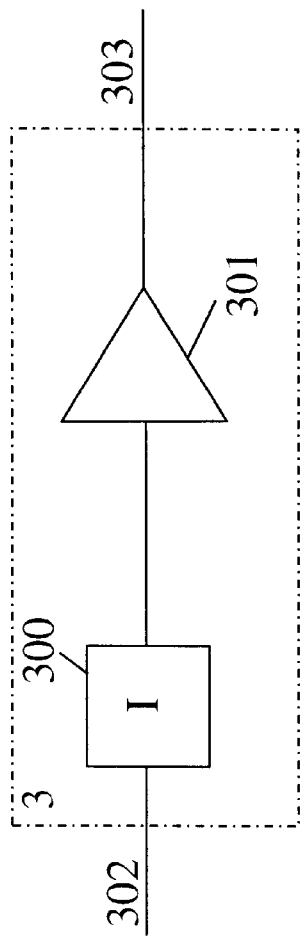
FIG. 3 shows a block diagram of an amplitude adjustment circuit in accordance with the present invention.

Referring now to FIG. 3, an amplitude-adjustment circuit (AAC) (3) is shown comprising a coarse attenuator (300) and a power amplifier (PA) (301) connected in series. The range of the fine attenuation of the signal effected by the control of the value of r is such that a continuous range of attenuation values can be achieved by appropriate setting of both the coarse (300) and fine (301) attenuation settings.

This circuit outputs a signal (303) which is similar to that of its input signal (302) in respects other than power level.

Figure 4:
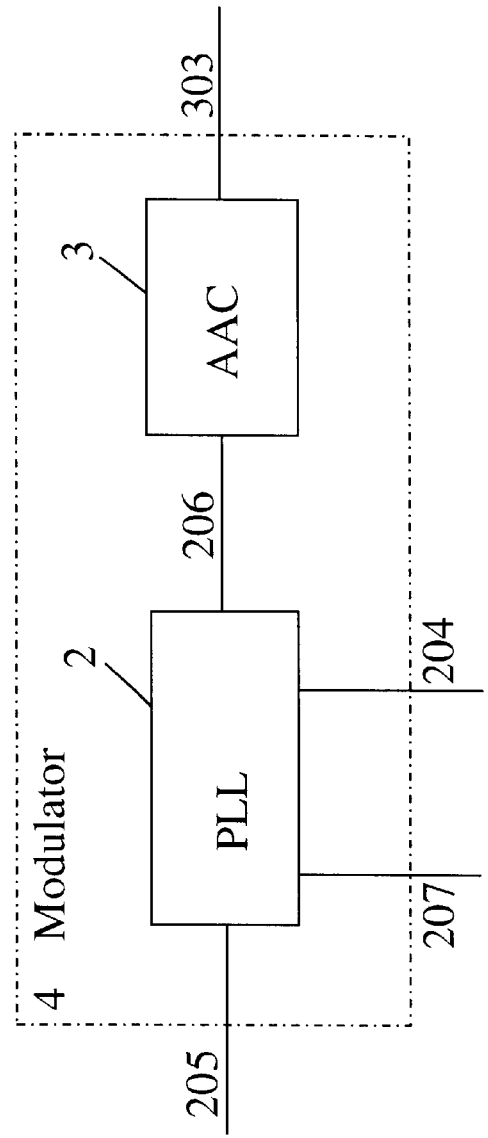
FIG. 4 shows a block diagram of a phase modulator in accordance with the present invention.

A phase-locked loop modulator (4), as shown in FIG. 4, comprises a PLL (2) (for example that of FIG. 2) and an AAC (3) (for example that of FIG. 3) connected in series, the phase-encoded signal output from the PLL (2) being fed to the AAC (3).

Figure 5:
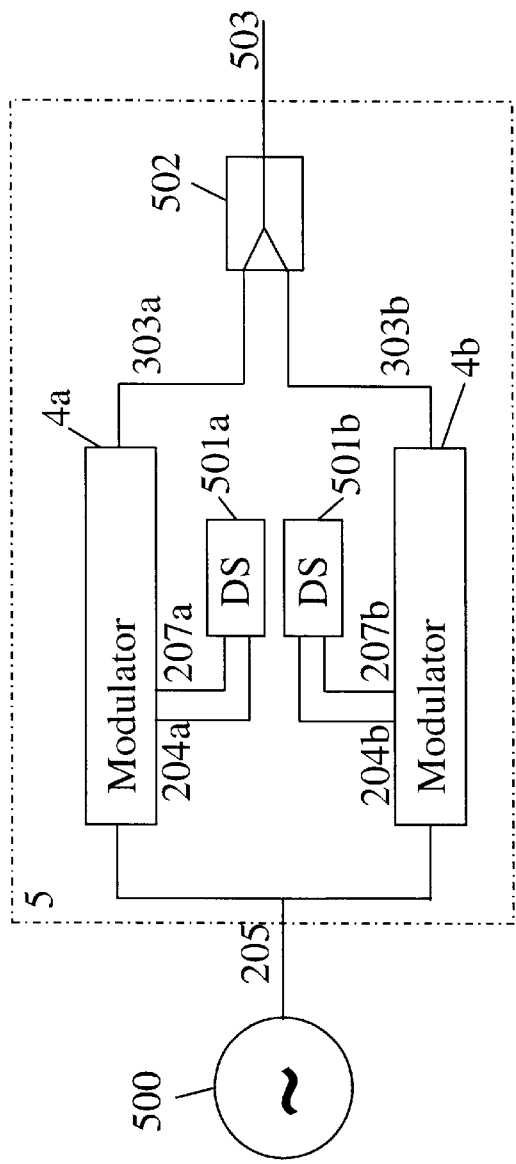
FIG. 5 shows a block diagram of phase and amplitude modulator in accordance with the present invention.

A first embodiment of a phase and amplitude modulator in accordance with the present invention, shown in FIG. 5, comprises a common source (500) of a reference signal, first and second PLL modulators (4a, 4b) (for example that of FIG. 4), and a signal combiner (502).

The reference signal (205) fed to each modulator is provided from the common reference source (500). Each modulator (4a, 4b) also receives a data signals (204a, 204b, 207a, 207b) from data source (501a, 501b) respectively. The phase-encoded output signal (303a, 303b) from each modulator is fed to the signal combiner (502) where they are combined to provide a phase and amplitude modulated output signal (503).

The signal (503) output from the signal combiner is a phase and amplitude encoding of the two data signals (204a, 204b) received by the respective modulators.

The common reference source (500) may, for example, comprise a reference oscillator also with programmable dividers and these, in conjunction with the PLL divider (203) in each modulator, are used to set the channel center frequency.

The values of ψ and ξ used to phase-encode the data onto the respective inputs of the two modulators (4a, 4b) may be calculated from the Cartesian i and q data of the desired output signal from the signal combiner (502) according to the equations given above. The relationship between the Cartesian i and q data and the amplitude r, as shown in equation (11), also mean that i and q may be chosen to have any desired amplitude and the input phases, ψ and ξ, adjusted to provide this. The selection of appropriate i, q, ψ, and ξ, may be made either prior to manufacture and hard-wired into the data sources (501a, 501b) or may chosen dynamically under software or hardware control. Sin(ψ) and cos(ψ) are fed to one modulator; sin(ξ) and cos(ξ) are fed to the other.

The method of modulating a single phase-encoded input signal onto a carrier signal derived from a given reference signal is known from GSM systems. In the Laplace Transform domain, if the phase of the VCO (202) of the first modulator (4a) is given by $\theta_1(s)$, and the phase into the phase adder (1) of the modulator (4a) is ψ(s), then $\theta_1(s)$ is given by the known relationship expressed in equation (13):

$$\theta_1(s)=H(s)\psi(s) \tag{13}$$

where H(s) is the closed loop transfer function of the PLL (2) of the modulator (4a), which depends on F(s) which is the transfer characteristic of the loop filter (101) of the PLL (1).

Similarly, for the PLL (2) of the second modulator (4b), the relationship is given in equation (14):

$$\theta_2(s)=H(s)\xi(s) \tag{14}$$

Consequently, correct phase modulation is dependant on the filter bandwidths of the loop filter (201) in each modulator (4a, 4b) being sufficiently wide so as not to cause any signal distortion. Note that both ψ(s) and ξ(s) have to be continuous functions, and the arctan and arccos operations must not be restricted to the principal branch: a discontinuous function of phase would necessarily require a very much greater loop bandwidth to avoid severe modulation distortion.

The AAC's (3) of the two modulators (4a, 4b) must be well balanced in order to maintain the correct signal relationship in each arm of the circuit prior to combining the signals in the signal combiner (502). This can be achieved by integrating both arms on a single chip or employing a mean power sensor on each arm and feeding back to adjust the input feeds (204a, 207a, 204b, 207b) to the modulators.

The signal combiner is preferably a low-loss Wilkinson combiner, but other low-loss combiners may be used.

Output signal level is set through choice of both coarse attenuator (300) setting in each modulator (4a, 4b) and the value of r set through modulation of the two PLL's and determined by the input phase values, ψ and ξ.

The continuous range of the input phase values, and hence r, set by the data sources should at least cover the step interval of the corresponding coarse attenuator. For example, the coarse attenuators (300) in each modulator (4a, 4b) may each having two settings, 0 dB and 30 dB, and may be employed in conjunction with data sources (501a, 501b) each having a continuous range of 0–30 dB, thereby providing an output signal range, in combination, of 0–60 dB.

By minimizing the number of components between the PLL (2) of each modulator and the combiner (502), build-up of component tolerances is also minimized, thereby requiring less dynamic range in the coarse attenuation (300) and in the fine attenuation provided by the data signal sources (501 a, 501b).

For a theoretically perfectly balanced system there would be nil spectral re-growth, but practical constraints mean there will in general be some small re-growth. At high power levels a conventional approach would exhibit quite severe spectral re-growth. In the present invention, however, since the signals passed through the non-linear amplifier (301) of each modulator are constant envelope, both spectral re-growth in the output signal and consequential interference into the adjacent channels are much reduced.

Output power of the oscillators will typically be nowhere near the full power requirement so amplification is required. The combined capability of the DSP-controlled attenuation and the step attenuator must therefore be sufficent to cover a dynamic range which nearly always cannot be handled by one single attenuator, especially at high frequencies.

Figure 6:
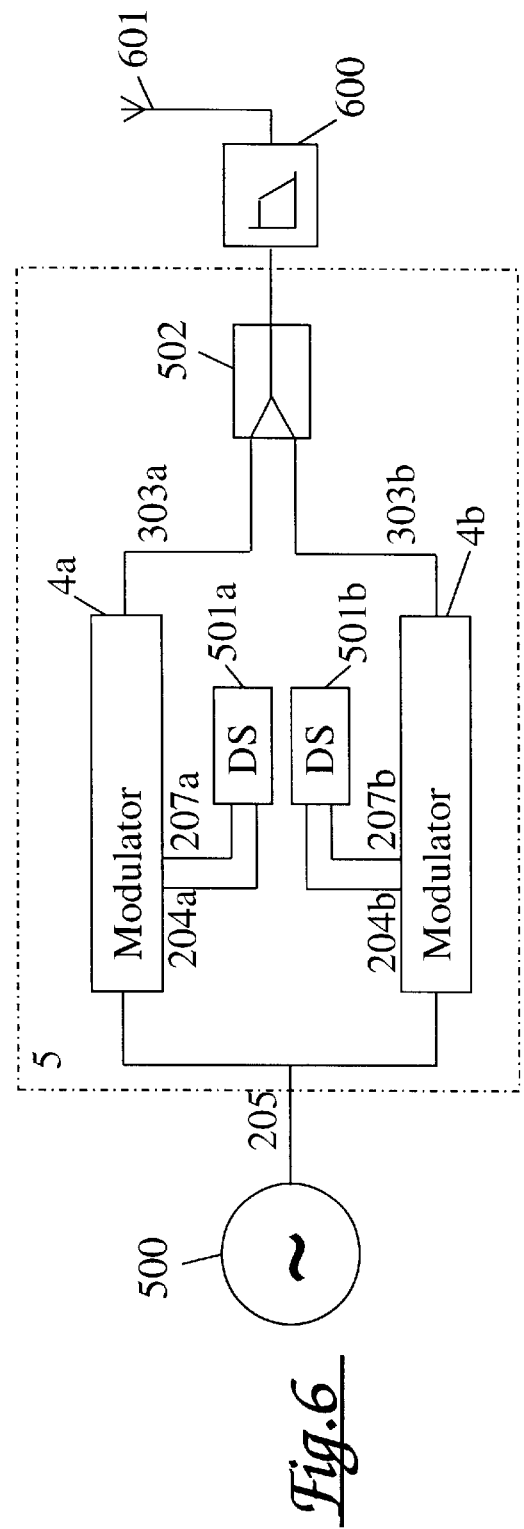
FIG. 6 shows a block diagram of a radio transmission system incorporating a phase and amplitude modulator in accordance with the present invention.

Referring now to FIG. 6, a radio transmission system is shown embodying a phase and amplitude modulation circuit (5) according to the present invention. The circuit embodies an instance of a modulator as shown in FIG. 3, together with a low-pass filter (600) and an antenna (601).

After signal addition by the combiner (502), the harmonics of the amplifiers (301) of each modulator (4a, 4b) are removed by the low pass filter (600) prior to routing to the antenna (601).

The PLL (2) of each modulator (4a, 4b) is locked to the same reference signal but separately phase-modulated to carry a potentially distinct data signal. Also, each phase-modulated signal is separately power-amplified (3) within the respective modulator (4a, 4b) before the two phase-modulated signals are combined (403) prior to the antenna connector.

This modulation technique impresses both phase and amplitude information onto a carrier (for example an RF or microwave carrier) whilst maintaining a constant power envelope on each of the two signal amplification arms. The constant power envelope reduces spectral regrowth and helps the power amplifier (301) to run more efficiently.

Since any combination of phase and amplitude can be accommodated using this technique, and by selecting PLL's and AAC's appropriate to the required carrier frequencies, a modulator can be constructed which can support any modulation format through software control of the baseband DSP's. This could also include any combination of any number many known formats including, for example, GMSK (GSM, DSCS1800), FM (AMPS), AM, π/4 DQPSK (DAMPS), QPSK, QAM, and any other scheme requiring amplitude and/or phase modulation.

Any range or device value given herein may be extended or altered without losing the effect sought, as will be apparent to the skilled person for an understanding of the teachings herein.

GLOSSARY

π/4 DQPSK π/4 Differentially-encoded Quaternary Phase Shift Keying
AMPS Advanced Mobile Phone System
DAMPS Digital Advanced Mobile Phone System
DCS1800 Digital Cellular System
FM Frequency Modulation
GMSK Gaussian Minimum Shift Keying
GSM Global System for Mobile Communications
QAM Quadrature Amplitude Modulation

We claim:

1. A baseband signal modulator for providing a phase and amplitude modulated carrier signal, said signal modulator comprising:
   first and second phase modulators each arranged to receive a common reference signal and to derive therefrom a carrier signal frequency, and each arranged to receive a respective pair of phase-encoded data signals so as to provide respective first and second phase-encoded carrier signals derived from the respective pair of phase-encoded data signals and said carrier signal frequency,
   and circuit means coupled to said phase modulators and arranged to sum said first and second phase-encoded carrier signals to provide the phase and amplitude modulated carrier signal,
   wherein each said phase modulator comprises a respective phase locked loop incorporating an oscillator locked via the common reference signal to the carrier signal frequency, and a phase adder incorporated with the oscillator in the phase locked loop and having a first input for receiving the carrier frequency signal and having second and third inputs for receiving the respective pair of phase-encoded data signals.

2. The signal modulator according to claim 1 wherein each said phase-encoded carrier signal is constant-envelope.

3. The signal modulator according to claim 1 wherein both the phase and amplitude of said phase and amplitude modulated carrier signal may be varied dependent upon the phases of each said pair of phase-encoded data signals.

4. The signal modulator according to claim 1 wherein each said phase-locked loop is coupled to an amplitude-adjustment circuit.

5. The signal modulator according to claim 4 wherein each phase-locked loop is an offset phase-locked loop.

6. The signal modulator according to claim 4 wherein the amplitude-adjustment circuit comprises a coarse attenuator and a power amplifier.

7. The signal modulator according to claim 1 wherein the phase-encoded data signals are phase-encoded using distinct phases.

8. The signal modulator according to claim 1 additionally comprising a signal source providing said common reference signal.

9. The signal modulator according to claim 1 wherein each phase-encoded data signal is a phase-encoded digital data signal.

10. The signal modulator according to claim 9 additionally comprising a digital signal processing means that provides said respective pairs of phase-encoded data signals.

11. A telecommunications system comprising one or more baseband signal modulators according to claim 1.

12. The signal modulator according to claim 1 wherein said phase and amplitude modulated carrier signal is a radio frequency signal.

13. A wireless, transmission system comprising the baseband signal modulator according to claim 1 and an antenna and a low-pass filter arranged to receive said phase and amplitude modulated carrier signal and to provide it to said antenna.

14. A wireless telecommunications system comprising one or more baseband signal modulators according to claim 1.

* * * * *